United States Patent
Jang et al.

(10) Patent No.: US 7,359,204 B1
(45) Date of Patent: Apr. 15, 2008

(54) MULTIPLE COVER MEMORY CARD

(75) Inventors: Sang Jae Jang, Gwangjin-gu (KR); Chul Woo Park, Gangdong-gu (KR); Jong Woon Choi, Nowon-gu (KR); Jae Dong Kim, Gwangjin-gu (KR); Choon Heung Lee, Gwangju (KR); Chang Deok Lee, Uijeongbu (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/355,092

(22) Filed: Feb. 15, 2006

(51) Int. Cl.
*H05K 7/20* (2006.01)

(52) U.S. Cl. .................. 361/715; 361/600; 361/679; 361/683; 361/740; 361/751; 365/63; 235/492

(58) Field of Classification Search ............ 361/600, 361/679, 760, 772, 683–685, 715, 728, 730, 361/736, 737, 740–748, 751–753, 785, 787, 361/791, 800; 365/63; 235/492
See application file for complete search history.

(56) References Cited

U.S. PATENT DOCUMENTS

| | | | |
|---|---|---|---|
| 3,668,299 A | 6/1972 | Mc Neal | |
| 4,532,419 A | 7/1985 | Takeda | |
| 4,905,124 A | 2/1990 | Banjo et al. | |
| 4,974,120 A | 11/1990 | Kodai et al. | |
| 5,155,663 A * | 10/1992 | Harase | 361/684 |
| 5,172,214 A | 12/1992 | Casto | |
| 5,360,992 A | 11/1994 | Lowrey et al. | |
| 5,574,309 A | 11/1996 | Papapietro et al. | |
| 5,742,479 A | 4/1998 | Asakura | |
| 5,753,532 A | 5/1998 | Sim | |
| 5,784,259 A * | 7/1998 | Asakura | 361/752 |
| 5,789,280 A | 8/1998 | Yokota et al. | |
| 5,808,359 A | 9/1998 | Muto et al. | |
| 5,822,190 A * | 10/1998 | Iwasaki | 361/737 |
| 5,893,724 A | 4/1999 | Chakravorty et al. | |
| 5,977,613 A | 11/1999 | Takata et al. | |
| 6,040,622 A | 3/2000 | Wallace | |
| 6,143,981 A | 11/2000 | Glenn | |
| D445,096 S | 7/2001 | Wallace | |
| D446,525 S | 8/2001 | Okamoto et al. | |
| 6,376,283 B1 | 4/2002 | Chen | |

(Continued)

FOREIGN PATENT DOCUMENTS

JP 3112688 5/1991

(Continued)

*Primary Examiner*—Tuan T. Dinh
*Assistant Examiner*—Xiaoliang Chen
(74) *Attorney, Agent, or Firm*—Stetina Brunda Garred & Brucker (57) ABSTRACT

A memory card including a module comprising at least a printed circuit board having an electronic circuit device mounted thereto and at least one I/O pad and at least one test pad disposed thereon. The module is inserted into a complementary cavity formed within a case of the memory card, such case generally defining the outer appearance of the memory card. The module is secured within the cavity of the case through the use of an adhesive. In each embodiment of the present invention, first and second covers are movably attached to a case for selectively covering or exposing the I/O pads and the test features/pads of the module of the memory card.

18 Claims, 7 Drawing Sheets

U.S. PATENT DOCUMENTS

| | | |
|---|---|---|
| 6,384,472 B1 | 5/2002 | Huang |
| 6,462,273 B1 | 10/2002 | Corisis et al. |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | Di Caprio et al. |
| 7,011,251 B1 * | 3/2006 | Miks et al. ............. 235/487 |
| 2002/0140068 A1 | 10/2002 | Lee |
| 2005/0099784 A1 * | 5/2005 | Wallace ............. 361/760 |

FOREIGN PATENT DOCUMENTS

| | | |
|---|---|---|
| JP | 7017175 | 1/1995 |
| JP | 8190615 | 7/1996 |
| JP | 10334205 | 12/1998 |
| KR | 199410938 | 5/1994 |
| KR | 199552621 | 12/1995 |

* cited by examiner

MULTIPLE COVER MEMORY CARD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to memory cards, and more particularly to a memory card (e.g., a multi-media card or secure digital card) comprising a semiconductor device module which is configured to be interfaced to an external case having first and second covers movably attached thereto for selectively exposing the I/O pads or contacts and the test features/pads of the module.

2. Description of the Related Art

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Many memory cards include a module which itself comprises a printed circuit board (PCB) having a conductive wiring pattern disposed thereon. Attached to one side or surface of the PCB and electrically connected to the conductive pattern thereof is a plurality of electronic circuit devices, such as semiconductor packages, semiconductor dies, and/or passive elements. These electronic circuit devices and a portion of the PCB are often covered or encapsulated by an encapsulant material. The PCB also includes a plurality of input/output (I/O) pads disposed on the side or surface thereof opposite that having the electronic circuit devices thereon. These I/O pads are not covered by the encapsulant material, and thus are exposed in the completed module which comprises the PCB, the electronic circuit devices and the encapsulant material. Attached to the module is a skin or case of the memory card, such case generally defining the outer appearance of the memory card. The module is coupled to the case such that the I/O pads disposed on the PCB are not covered by the case, and thus remain exposed in the fully assembled memory card. These I/O pads of the memory card provide an external interface for an insertion point or socket. The completed memory card has a generally rectangular configuration, with most memory cards including a chamfer formed at one edge thereof which is adjacent to the I/O pads.

As indicated above, the I/O pads of the memory card are exposed to allow for the transmission and receipt of signals between the memory card and an external device. Because they are exposed, the I/O pads are susceptible to short-circuiting as a result of coming into contact with conductive substances, such short circuiting carrying the risk of varying or deleting the data stored within the memory card. In order to avoid such risk, some currently known memory cards include a separate lower case on which a guide block is formed. However, even in those memory cards including a guide block, there is still a possibility that a short circuit may occur among the plurality of I/O pads. For example, a memory card having a guide block is still susceptible to a short circuit occurring as a result of conductive substances or structures which are not of a fixed shape (e.g., are flexible) coming into contact with the I/O pads. As previously explained, such a short circuit may alter or delete data within the onboard electronic circuit devices of the memory card.

Further, after assembly, memory cards as currently known in the art are tested to confirm whether or not the circuit is open. The I/O pads are commonly used for performing the test. However, completing this testing using the I/O pads usually takes a long time, particularly when the number of I/O pads is small. This is because a limited number of I/O pads must be used to test the entire memory card. As a result, some currently known memory cards also include a number of test pads or features that are separately formed on the memory card module and initially exposed in the memory card. These test pads/features are adapted to be used during the testing process to shorten test time. However, these test pads/features, if included in the memory card, provide the same shorting risk as do the I/O pads, and therefore must typically be covered with a layer of tape after the completion of the test. The present invention provides a memory card which is uniquely configured to include first and second covers movably attached to a case thereof for selectively covering or exposing the I/O pads and the test features/pads of the module of the memory card.

BRIEF SUMMARY OF THE INVENTION

In accordance with the present invention, there is provided multiple embodiments of a memory card, each embodiment including a module comprising at least a printed circuit board having an electronic circuit device mounted thereto and at least one I/O pad and at least one test pad disposed thereon. The module is inserted into a complementary cavity formed within a case of the memory card, such case generally defining the outer appearance of the memory card. The module is secured within the cavity of the case through the use of an adhesive. In each embodiment of the present invention, first and second covers are movably attached to a case for selectively covering or exposing the I/O pads and the test features/pads of the module of the memory card.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Referring now to the drawings wherein the showings are for purposes of illustrating preferred embodiments of the present invention only, and not for purposes of limiting the same, FIGS. 1A-1F depict a memory card 100 constructed in accordance with a first embodiment of the present invention. The memory card 100, as well as the memory cards of other embodiments of the present invention which will be described in more detail below, may be a multi-media card (MMC), a reduced size multi-media card (RSMMC), or a secure digital (SD) card. Additionally, the memory card 100 and those memory cards of the other embodiments described below may each be an SMT type memory card or a COB type memory card.

The memory card 100 includes a module 110 which comprises a circuit board 120. The circuit board 120 itself includes an insulative layer 123 defining a generally planar lower surface 121 and an opposed, generally planar upper surface 122. Formed on the lower surface 121 of the insulative layer 123 in close proximity to one of the peripheral edge segments thereof is a plurality of input/output (I/O) pads 124. The insulative layer 123 has a generally quadrangular (e.g., rectangular) configuration defining opposed pairs of longitudinally and laterally extending sides, with the I/O pads 124 extending along and in close proximity to a common one of the laterally extending sides of the insulative layer 123. The laterally extending side of the insulative layer 123 disposed closest to the I/O pads 124 will hereinafter be referred to as the front side, with the opposite laterally extending side of the insulative layer 123 being referred to as the back side. Formed on the upper surface 122 of the insulative layer 123 is a conductive pattern which is placed into electrical communication with the I/O pads 124 on the lower surface 121 through a conductive medium formed through and/or upon the insulative layer 123. Such conductive medium may include conductive vias which extend through the insulative layer 123, conductive traces which extend along the upper and lower surfaces 122, 121 of the insulative layer 123, or combinations thereof. The circuit board 120 can be a hardened printed circuit board, a flexible printed circuit board, or any equivalent thereto, the present invention not being restricted to any particular type of circuit board 120.

Mounted to the upper surface 122 of the insulative layer 123 of the circuit board 120 is an electronic circuit device 130. The mounting of the electronic circuit device 130 to the circuit board 120 is preferably facilitated by a layer 139 of a suitable adhesive. As best seen in FIG. 1C, the electronic circuit device 130 comprises a pair of semiconductor dies which are each electrically connected to the conductive pattern formed on the upper surface 122 through the use of conductive wires 135. A flip chip interconnection may also be employed to facilitate the electrical connection of the electronic circuit device 130 to the conductive pattern of the circuit board 120. As will be recognized, the conductive pattern and/or conductive medium of the circuit board 120 may be used to facilitate the placement of the electronic circuit device 130 into electrical communication with the I/O pads 124 in any desired pattern or arrangement. Those of ordinary skill in the art will recognize that rather than comprising only the semiconductor dies, the electronic circuit device 130 may comprise a semiconductor die or a semiconductor package alone or in combination with various passive devices (e.g., a resistor and/or a condenser). Further, it is contemplated that one or more components of the electronic circuit device 130 can be vertically stacked. In this regard, the type, number and arrangement of the components included in the electronic circuit device 130 may be selectively varied depending on the desired application for the memory card 100. All that is necessary is that the circuit board 120 be configured to facilitate the electrical communication between any such component(s) and the I/O pads 124 in a prescribed manner. Along these lines, the number of I/O pads 124 included in the circuit board 120 is also variable, in that the number of such I/O pads 124 may be varied according to the particular application for the memory card 100.

In addition to the I/O pads 124, formed on the lower surface 121 of the insulative layer are a plurality of test features or pads 126. The test pads 126 are each electrically connected to the conductive pattern formed on the upper surface 122 of the insulative layer 123 by the conductive medium, and thus are in electrical communication with the electronic circuit device 130 by virtue of the electrical connection of the electronic circuit device 130 to the conductive pattern by the conductive wires 135. Since the test pads 126 are electrically connected to the electronic circuit device 130, they may be used to test the memory card 100 as will be discussed in more detail below.

In the module 110 of the memory card 100, the electronic circuit device 130, the conductive pattern, and the conductive wires 135 are covered by a layer of encapsulant material which hardens into a body 140 of the module 110. The body 140 may be formed from an epoxy molding compound, a glop top, or an equivalent thereof. The body 140 defines a generally planar lateral front side surface which is substantially flush or continuous with the front side of the insulative layer 123. In addition to the front side surface, the body 140 defines a generally planar lateral rear side surface which is substantially flush or continuous with the back side of the insulative layer 123, and an opposed pair of generally planar longitudinal side surfaces which are substantially flush with respective ones of the longitudinally extending sides of the insulative layer 123 which extend generally perpendicularly between the front and back sides thereof. In the module 110, the height of the body 140 (i.e., the distance separating the top surface of the body 140 from the upper surface 122 of the insulative layer 123) is predetermined according to the height of the electronic circuit device 130 encapsulated by the body 140.

It is contemplated that the body 140 of the module 110 may be formed to include a chamfer 147 formed at least one of its four corners between the front lateral side surface and one of the longitudinal side surfaces thereof. Along these lines, if the chamfer 147 is included in the body 140, a corresponding chamfer will typically be formed on the underlying insulative layer 123 that that the chamfer 147 and the chamfer of the insulative layer extend in substantially flush relation to each other. The chamfer 147, if included, may be used as a guide when the module 110 is inserted into a case 150 of the memory card 100, as discussed below.

As indicated above, in addition to the module 110, the memory card 100 comprises a case 150. The case 150 has a plate-like shape of predetermined thickness. More particularly, as seen in FIGS. 1A-1E, the case 150 defines a generally planar bottom surface 151 and an opposed, generally planar top surface 152. In addition, the case 150 defines a generally planar front side 153 and an opposed, generally planar rear side 154. Extending generally perpendicularly from the rear side 154 is an opposed pair of generally planar longitudinal sides 155, 156 of the case 150. The case 150 is further formed to include at least one generally planar chamfer 157 which extends angularly between the front side 153 and one of the longitudinal sides 155, 156. Formed in the bottom surface 151 of the case 150 is a recess or cavity 158 which is sized and configured to accommodate the module 110 in the manner shown in FIG. 1C. In the memory card 100, the module 110 is inserted into and secured within the cavity 158 in a manner which will be discussed below.

In the memory card 100, the cavity 158 is preferably oriented within the case 150 so as to be disposed in relative close proximity to the front side 153 thereof. As indicated above, the shape of the cavity 158 is complimentary to that of the module 110, the cavity 158 shown in FIG. 1C having a generally quadrangular configuration defining four separate corners, one of which may be chamfered to correspond to the chamfer 147 of the module 110. If a chamfer is defined by the cavity 158, it is contemplated that such chamfer will extend in generally parallel relation to the chamfer 157 defined by the case 150. However, those of ordinary skill in the art will recognize that the shape of the cavity 158 is not limited to such a four cornered configuration, with it being contemplated that the cavity 158 may take the form of any one of various shapes depending on the shape of the module 110. The depth of the cavity 158 is preferably sized such that when the module 110 is fully advanced thereinto and secured therewithin, the lower surface 121 of the insulative layer 123 of the circuit board 120 will extend in substantially flush, continuous relation to the bottom surface 151 of the case 150, as also shown in FIG. 1C.

In the memory card 100, the module 110 is secured within the cavity 158 by a layer 160 of adhesive which is preferably applied to the internal, innermost top wall of the cavity 158 and/or portions of the top surface of the body 140 in a predetermined thickness. The layer 160 may be formed using a film type adhesion tape or a liquid adhesive. When the module 110 is advanced into the cavity 158, the adhesive layer 160 is interposed between portions of the top surface of the body 140 and the internal top wall of the cavity 158, thus adhering and affixing the module 110 to the case 150. As indicated above, the depth of the cavity 158 is preferably sized such that when the module 110 is secured therein via the layer 160, the lower surface 121 of the insulative layer 123 of the circuit board 120 is substantially flush or continuous with the generally planar bottom surface 151 of the case 150.

Figure 1A:
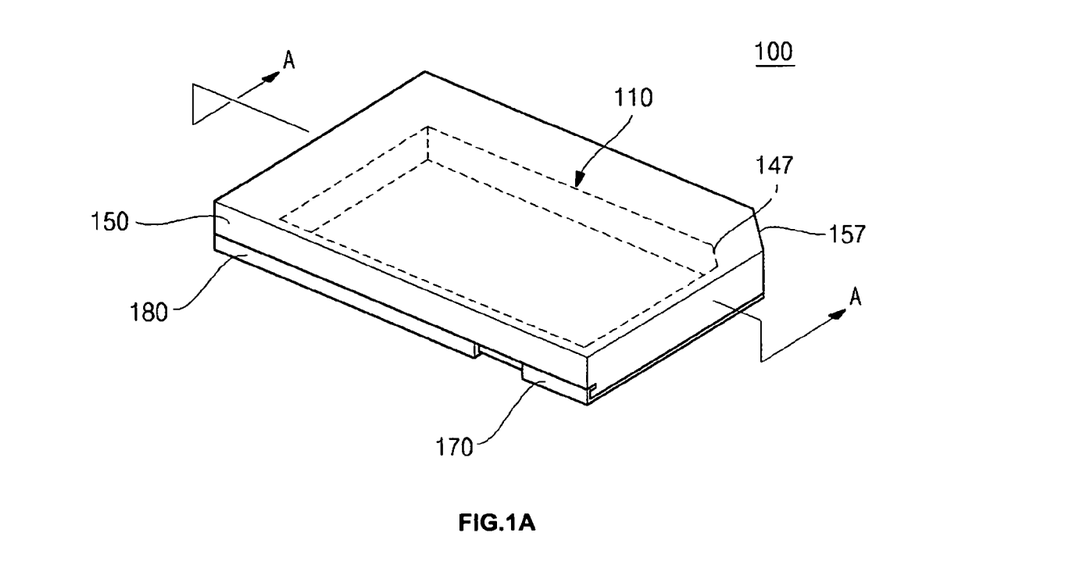
FIG. 1A is a top perspective view of a memory card constructed in accordance with a first embodiment of the present invention.
Figure 1B:
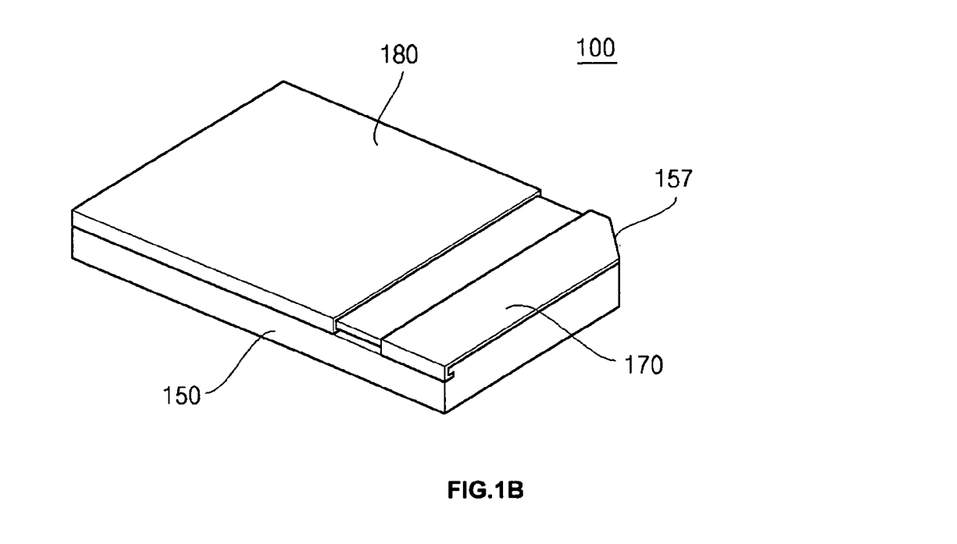
FIG. 1B is a bottom perspective view of the memory card shown in FIG. 1A, further illustrating the first and second covers of the memory card in a closed position.
Figure 1C:
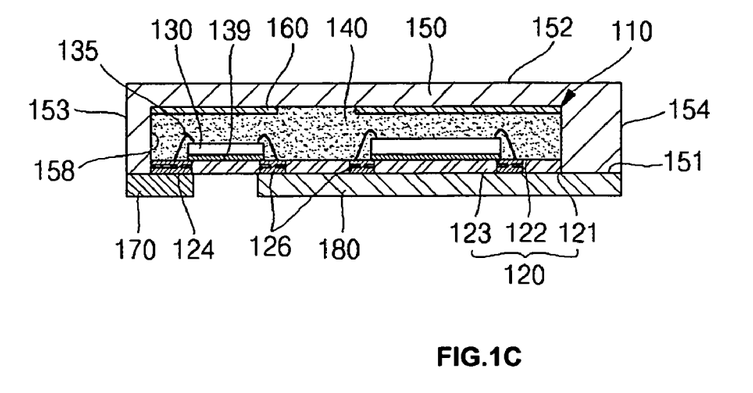
FIG. 1C is a cross-sectional view taken along line A-A of FIG. 1A.
Figure 1D:
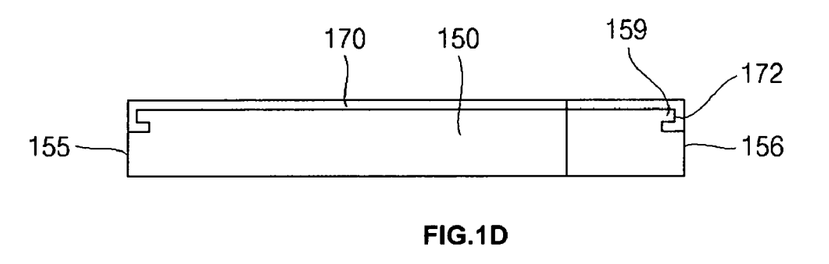
FIG. 1D is a front elevational view of the memory card shown in FIG. 1B.
Figure 1E:
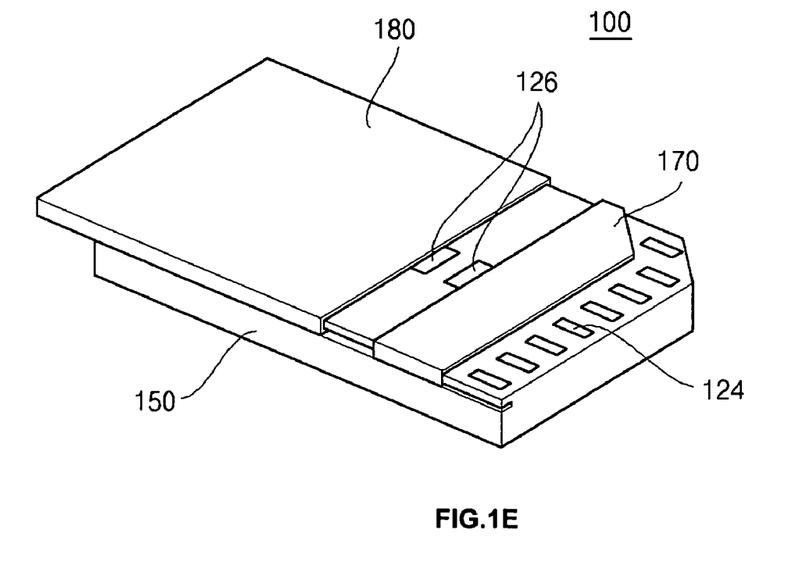
FIG. 1E is a bottom perspective view of the memory card of the first embodiment similar to that shown in FIG. 1B, but further illustrating the first and second covers of the memory card in an open position.

The memory card 100 further comprises a first cover 170 which is slideably mounted to the case 150, and is selectively moveable between a closed position (shown in FIG. 1B) and an open position (shown in FIG. 1E). When in its closed position, the first cover 170 is sized and configured to cover or shield the I/O pads 124 of the module 110. The movement of the first cover 170 to its open position facilitates the uncovering or exposure of the I/O pads 124. To facilitate the slideable attachment of the first cover 170 to the case 150, the first cover 170 is formed to define an opposed pair of slide grooves 172 which are best shown in FIG. 1D. The slide grooves 172 of the first cover 170 are sized and configured to receive respective ones of an opposed pair of elongate retainers 159 which extend along respective ones of the longitudinal sides 155, 156 of the case 150. The receipt of the retainers 159 into respective ones of the slide grooves 172 in the manner shown in FIG. 1D allows the first cover 170 to be slideably moved along the longitudinal sides 155, 156 of the case 150, and hence along the longitudinal axis of the case 150 between the laterally extending front and rear sides 153, 154 thereof. Thus, when transitioning from its closed position to its open position, the first cover 170 moves toward the rear side 154 of the case 150. Conversely, when transitioning from its open position to its closed position, the first cover 170 moves toward the front side 153 of the case 150. As is further seen in FIGS. 1B and 1E, the first cover 170 is formed to include a chamfer which, when the first cover 170 assumes its closed position as shown in FIG. 1B, extends along and is substantially flush with the chamfer 157 defined by the case 150. As indicated above, the sliding movement of the first cover 170 to its open position as shown in FIG. 1E effectively uncovers and thus exposes each of the I/O pads 124 of the module 110.

In addition to the first cover 170, also included in the memory card 100 is a second cover 180. Like the first cover 170, the second cover 180 is formed to include the slide grooves 172 which also receive respective ones of the opposed retainers 159 defined by the case 150 and extending along respective ones of the longitudinal sides 155, 156 thereof. The second cover 180 has a generally quadrangular configuration, and is selectively moveable between a closed position (shown in FIG. 1B) and an open position (shown in FIG. 1E). When in its closed position, the second cover 180 effectively covers or shields the test pads 126 disposed on the lower surface 121 of the insulative layer 123 of the module 110. Like the first cover 170, the second cover 180 is slideably moveable along the longitudinal axis of the case 150, the sliding movement of the second cover 180 to its open position shown in FIG. 1E effectively uncovering and exposing the test pads 126. As is further seen in FIG. 1E, the movement of the second cover 180 to its open position results in one of the four peripheral edge segments defined by the second cover 180 protruding beyond the rear side 154 of the case 150. When the second cover 180 is in its closed position as shown in FIG. 1B, that edge segment thereof which protrudes beyond the rear side 154 when the second cover 180 is in its open position extends along and in substantially flush relation to the rear side 154.

As is shown in FIGS. 1A-1C, the first and second covers 170, 180 are preferably sized relative to each other such that when each is slideably engaged to the case 150 in the above-described manner and moved to its closed position, a gap is defined therebetween. Advantageously, the formation of this gap allows the first cover 170 to be slideably moved from its closed position to its open position without the necessity of having to move the second cover 180 from its closed position to its open position. Thus, when both the first and second covers 170, 180 are oriented in their closed positions, a portion or segment of the lower surface 121 of the insulative layer 123 of the circuit board 120 is uncovered and thus exposed.

The memory card 100 is typically advanced into a host socket formed on an electronic device such as a digital camera, thus allowing the memory card 100 to be electrically connected to such external device for purposes of transmitting and receiving signals. Prior to such advancement into the host socket, it is contemplated that the first cover 170 of the memory card 100 will be slid into its open state or position, thus exposing the I/O pads 124. The subsequent advancement of the memory card 100 into the host socket allows the exposed I/O pads 124 to be electrically connected to the corresponding leads or terminals disposed inside the host socket, thus allowing data to be stored in and retrieved from the memory card 100. When the memory card 100 is not coupled to the host socket of the electronic device, it is contemplated that the first cover 170 will be slid into its closed state or position, thus covering the I/O pads 124. As a result of the I/O pads being covered and thus protected by the first cover 170, a short circuit is avoided among the I/O pads 124. Prevention of any short circuiting between the I/O pads 124 of the memory card 100 prevents inadvertent damage or deletion of the data stored thereon. Though not shown, it is further contemplated that the first cover 170 may be outfitted with an elastic body such as a spring. Such elastic body/spring would be oriented on the first cover 170 so as to be compressed when the first cover 170 is slid from its closed position to its open position, the first cover 170 being configured to be automatically forced to its open position and the elastic body/spring compressed as a result of the advancement of the memory card 100 into the host socket. When the memory card 100 is removed from the host socket, the biasing force exerted by the elastic body/spring would effectively return the first cover 170 from its open position back to its closed position effectively covering the I/O pads 124. Thus, the optional inclusion of such elastic body/spring on the first cover 170 automatically facilitates the movement of the first cover 170 from its open position back to its closed position upon the removal of the memory card 100 from within the host socket.

Figure 1F:
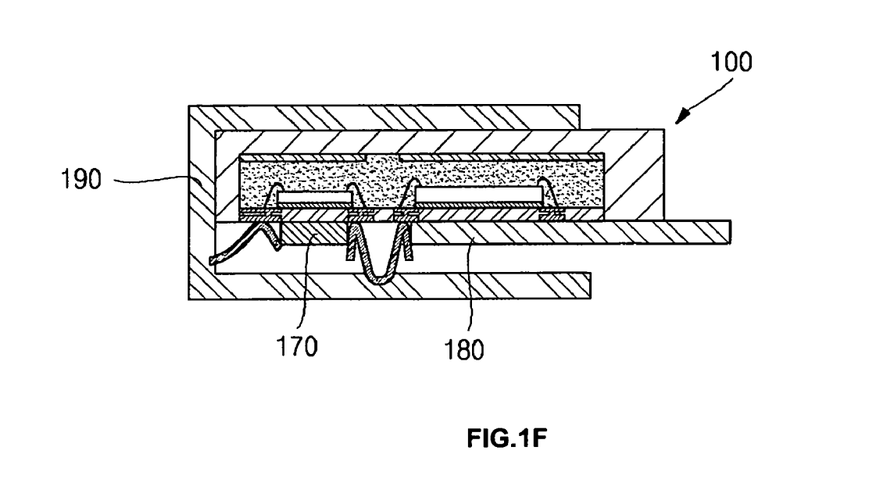
FIG. 1F is a cross-sectional view of the memory card of the first embodiment similar to that shown in FIG. 1C, but further illustrating the memory card as cooperatively engaged to a test socket.

Referring now to FIG. 1F, before being placed on the market, the memory card 100 must be tested to confirm that it is functioning in a prescribed manner. As indicated above, the test pads 126 of the circuit board 120 are used for such testing. In order to allow for such testing, the second cover 180 is slid into its open state or position, thereby exposing the test pads 126. The memory card 100, having both the first and second covers 170, 180 in the open state or position, is inserted into a test socket 190 for purposes of verifying its functionality. Upon the completion of the requisite testing, the second cover 180 is slid from its open position back to its closed state or position. The second cover 180 may be slid back to its open position even after being placed on the market so that if and when the memory card 100 has a problem, the test features 126 can be exposed and used for a retest thereof. Though not shown, it is contemplated that the second cover 180, like the first cover 170 described above, may also be formed with some type of elastic body/spring which is compressed when the second cover 180 is slid from its closed position to its open position, such movement/compression occurring automatically upon the advancement of the memory card 100 into the test socket 190. When the memory card 100 is removed from within the test socket 190, the biasing force exerted by the elastic body/spring effectively returns the second cover 180 from its open position to its closed position, thus covering the test pads 126.

Figure 2A:
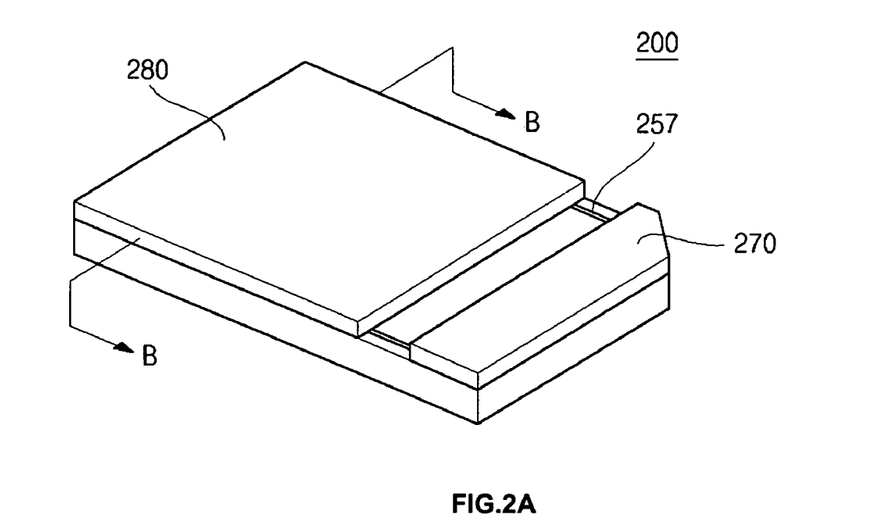
FIG. 2A is a bottom perspective view of a memory card constructed in accordance with a second embodiment of the present invention, further illustrating the first and second covers of the memory card in a closed position.
Figure 2B:
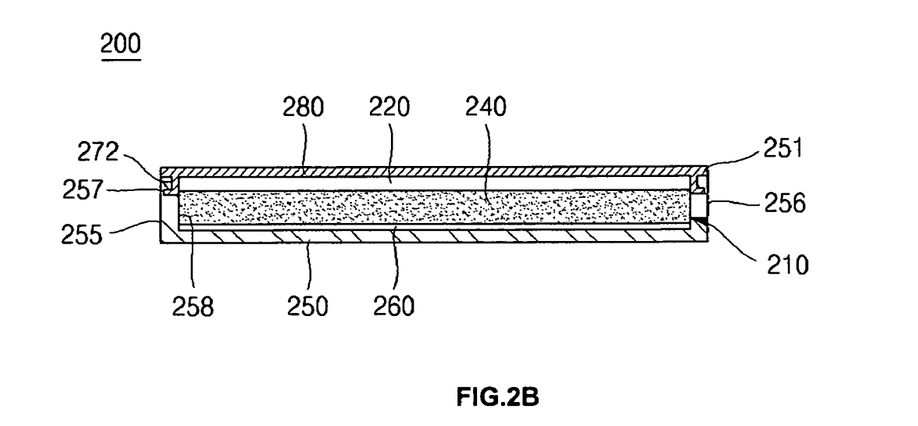
FIG. 2B is a cross-sectional view taken along line B-B of FIG. 2A.

Referring now to FIGS. 2A and 2B, there is shown a memory card 200 constructed in accordance with a second embodiment of the present invention. The memory card 200 of the second embodiment bears substantial similarity in construction to the memory card 100 of the first embodiment, with the 200 series reference numerals in FIGS. 2A and 2B being used to identify the same structures identified by the corresponding 100 series reference numerals included in FIGS. 1A-1E. In this regard, only the distinctions between the memory cards 200, 100 will be discussed below.

In the memory card 200, the case 250 thereof is provided with an opposed pair of elongate, generally parallel retaining grooves 257 as an alternative to the retainers 159 formed on and extending along respective ones of the longitudinal sides 155, 156 of the case 150 of the memory card 100. The retaining grooves 257 are formed in the lower surface 251 of the case 250 and extend in close proximity to respective ones of the longitudinal sides 255, 256 thereof. As is best seen in FIG. 2B, each of the grooves 257 has a generally L-shaped configuration.

In the memory card 200, the first and second covers 270, 280 each define a spaced, generally parallel pair of protrusions 272 which each have a configuration complimentary to that of the retaining grooves 257. In this regard, the receipt of the protrusions 272 of the first and second covers 270, 280 into respective ones of the retaining grooves 257 of the case 250 effectuates the slideable attachment of the first and second covers 270, 280 to the case 250. Upon such slideable engagement, the first and second covers 270, 280 are each moveable between open and closed positions relative to the case 250 in the same manner described above in relation to the first and second covers 170, 180 and case 150 of the memory card 100.

Figure 3A:
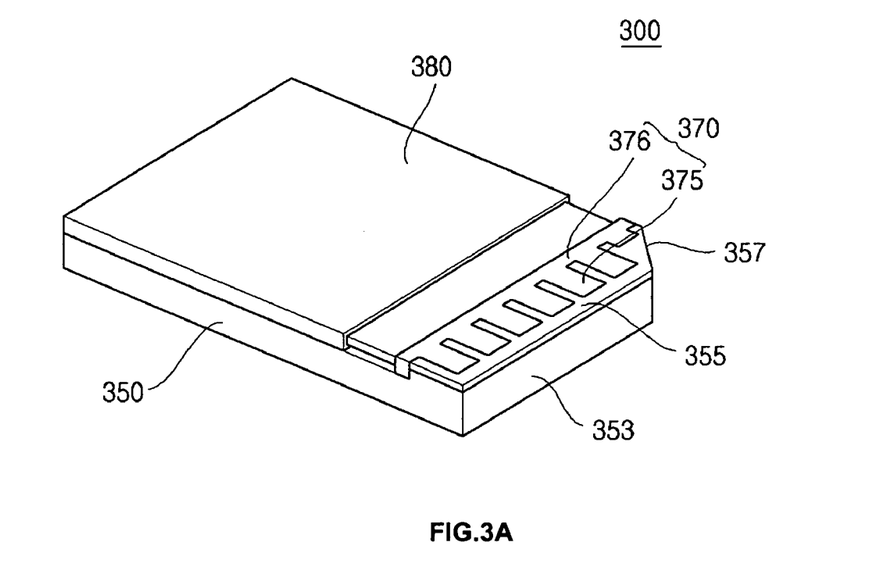
FIG. 3A is a bottom perspective view of a memory card constructed in accordance with a third embodiment of the present invention, further illustrating the first and second covers of the memory card in a closed position.
Figure 3B:
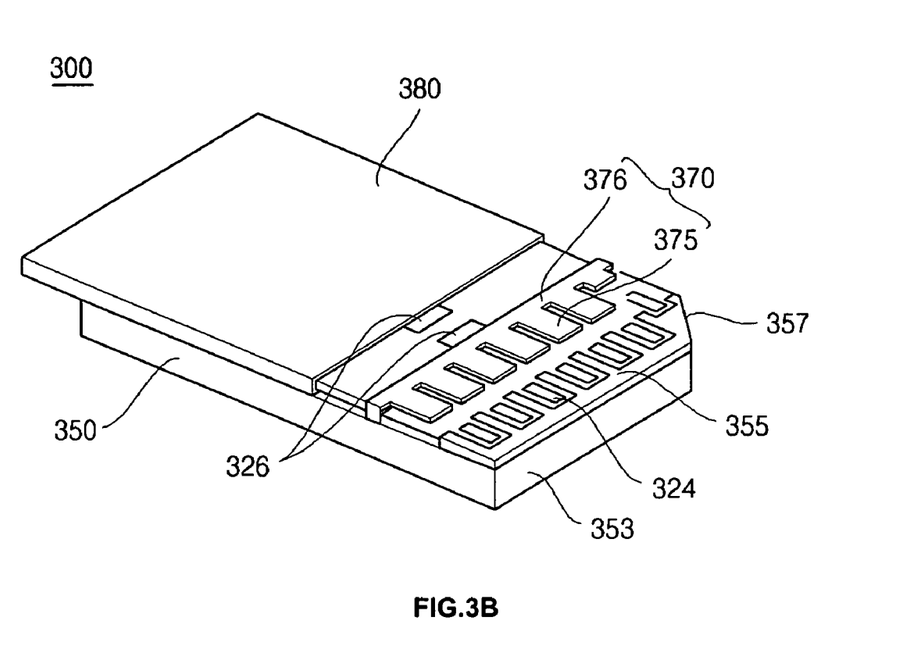
FIG. 3B is a bottom perspective view of the memory card of the third embodiment similar to that shown in FIG. 3A, but further illustrating the first and second covers of the memory card in an open position.

Referring now to FIGS. 3A and 3B, there is shown a memory card 300 constructed in accordance with a third embodiment of the present invention. The memory card 300 of the third embodiment also bears substantial similarity in construction to the memory card 100 of the first embodiment, with the 300 series reference numerals in FIGS. 3A and 3B being used to identify the same structures identified by the corresponding 100 series reference numerals included in FIGS. 1A-1E. In this regard, only the distinctions between the memory cards 300, 100 will be discussed below.

In the memory card 300, the case 350 is formed to include a guide block 355 which is adapted to avoid any short circuiting among the I/O pads 324. As seen in FIGS. 3A and 3B, the guide block 355 is positioned so as to extend along the front side 353 and the chamfer 357 of the case 350. Additionally, the guide block 355 is shaped so as to include portions which extend between and thus effectively separate adjacent pairs of the I/O pads 324 from each other. The guide block 355 is preferably formed to have a height or thickness generally corresponding to that of the first cover 370 slideably mounted to the case 350.

The first cover 370 is preferably formed to define a plurality of couplers 375 which are integrally connected to and extend from a common side of a supporter 376. The number of couplers 375 included on the first cover 370 corresponds to the number of I/O pads 324 included in the memory card 300. The couplers 375 are sized and oriented so as to be slideably advanceable into respective ones of the slots defined by the guide block 355, the I/O pads 324 being located in respective ones of such slots. In this respect, each coupler 375 has a shape corresponding to the slot of the guide block 355 into which it is advanced, thus facilitating the receipt of each coupler 375 into a corresponding slot in a nested fashion when the first cover 370 is moved to its closed position. Thus, when the first cover 370 is in its closed position, the couplers 375 thereof effectively cover or shield respective ones of the I/O pads 324. The first cover 370 is shown in its closed position in FIG. 3A, and in its open position effectively exposing the I/O pads 324 in FIG. 3B. In addition to the first cover 370, the memory card 300 also includes the second cover 380 which is also slideably mounted to the case 350. The structures which are used to facilitate the slideable attachment of the first and second covers 370, 380 to the case 350 in the memory card 300 are the same as those described above in relation to the memory card 100.

Figure 4:
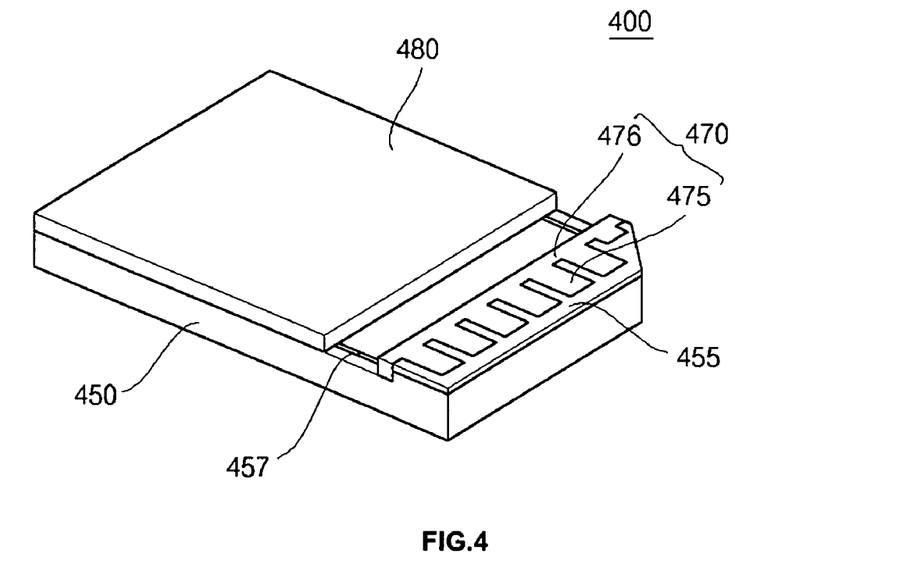
FIG. 4 is a bottom perspective view of a memory card constructed in accordance with a fourth embodiment of the present invention, further illustrating the first and second covers of the memory card in a closed position.

Referring now to FIG. 4, there is shown a memory card 400 constructed in accordance with a fourth embodiment of the present invention. The memory card 400 of the fourth embodiment bears substantial similarity in construction to the memory card 300 of the third embodiment, with the 400 series reference numerals in FIG. 4 being used to identify the same structures identified by the corresponding 300 series reference numerals included in FIGS. 3A and 3B. In this regard, only the distinctions between the memory cards 400, 300 will be discussed below.

As indicated above, the structures used to facilitate the slideable attachment of the first and second covers 370, 380 of the memory card 300 to the case 350 thereof are the same as those previously described in relation to the memory card 100 shown in FIGS. 1A-1F. Similarly, those structures of the memory card 400 which are used to facilitate the slideable attachment of the first and second covers 470, 480 to the body 450 thereof are the same as those previously described in relation to the memory card 200 shown in FIGS. 2A and 2B.

Figure 5A:
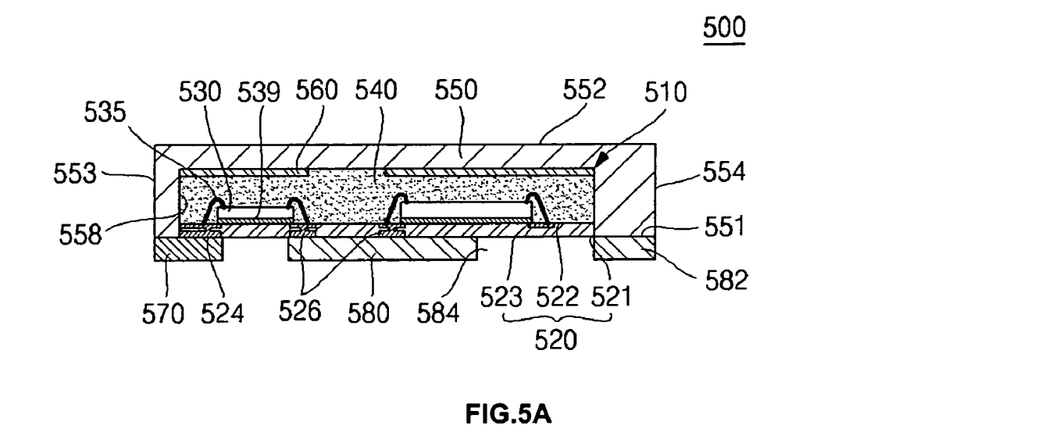
FIG. 5A is a cross-sectional view of a memory card constructed in accordance with a fifth embodiment of the present invention, further illustrating the first and second covers of the memory card in a closed position.
Figure 5B:
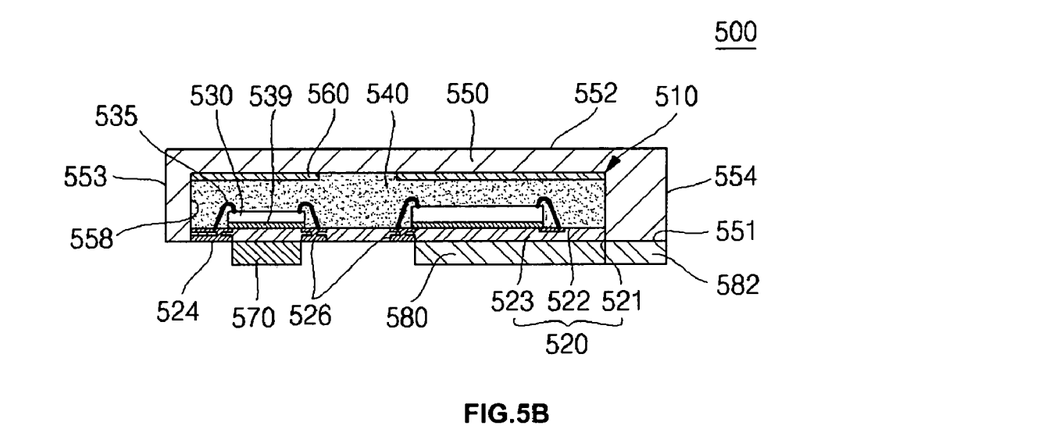
FIG. 5B is a cross-sectional view of the memory card of the fifth embodiment similar to that shown in FIG. 5A, but further illustrating the first and second covers of the memory card in an open position.

Referring now to FIGS. 5A and 5B, there is shown a memory card 500 constructed in accordance with a fifth embodiment of the present invention. The memory card 500 of the fifth embodiment bears similarity to the memory card 100 of the first embodiment, with the 500 series reference numerals in FIGS. 5A and 5B being used to identify the same structures identified by the corresponding 100 series reference numerals included in FIGS. 1A-1E. In this regard, only the distinctions between the memory cards 500, 100 will be discussed below.

As explained above in relation to the memory card 100 and as shown in FIG. 1E, the movement of the second cover 180 to its open position results in one of the four peripheral edge segments defined thereby protruding beyond the rear side 154 of the case 150. In the memory card 500, the second cover 580 thereof is shorter or of reduced longitudinal length in comparison to the first cover 180 of the memory card 100. In addition, the memory card 500 includes an anti-protrusion portion 582 which has a generally quadrangular configuration, and is disposed on a portion of the bottom surface 551 of the case 550. More particularly, the anti-protrusion portion 582 is located such that one side thereof terminates at approximately the circuit board 520 of the module 510, with an opposed side extending in substantially flush relation to the rear side 554 of the case 550. The remaining opposed sides of the anti-protrusion portion 582 may extend to and in substantially flush relation with respective ones of the longitudinal sides of the case 550. It is contemplated that the anti-protrusion portion 582 may be separately fabricated and attached to the lower surface 551 of the case 550 in the aforementioned orientation through the use of an adhesive, or may alternatively be fabricated as an integral part of the case 550. Further, the anti-protrusion portion 582 is preferably formed to have a thickness substantially equal to that of the second cover 580, with a preferred width of the anti-protrusion portion 582 being the same as the width of the case 550, i.e., the distance separating the longitudinal sides of the case 550 from each other.

As a result of the shortening of the second cover 580 in the memory card 500 and the addition of the anti-protrusion portion 582 to the case 550, the movement of the second cover 580 to its closed position as shown in FIG. 5A facilitates the formation of a sliding space 584 between the second cover 580 and the anti-protrusion portion 582. The width of the sliding space 584 is approximately the same as the span or distance between the test pads 526. As such, when the second cover 580 is slid away from the test pads 526 to its open position, the test pads 526 are effectively exposed, despite the second cover 580 being stopped by the anti-protrusion portion 582. Thus, the anti-protrusion portion 582 prevents the second cover 580 from protruding beyond the rear side 554 of the case 550 so that, when the memory card 500 is inserted into a host socket, no portion thereof protrudes out of such socket.

It is contemplated that in the memory card 500 of the fifth embodiment, the structures used to facilitate the slideable attachment of the first and second covers 570, 580 to the case 550 may be the same as those used to facilitate the slideable attachment of the first and second covers 170, 180 to the case 150 in the memory card 100, or alternatively those used to facilitate the slideable attachment of the first and second covers 270, 280 to the case 250 in the memory card 200. Further, it is contemplated that the memory card 500 may be outfitted with a guide block such as the guide blocks 355, 455 shown and described in relation to the memory cards 300, 400. As will be recognized, if such guide block is included in the memory card 500, the first cover 570 thereof will be configured to mirror the configurations of the first covers 370, 470 of the memory cards 300, 400 described above.

Figure 6:
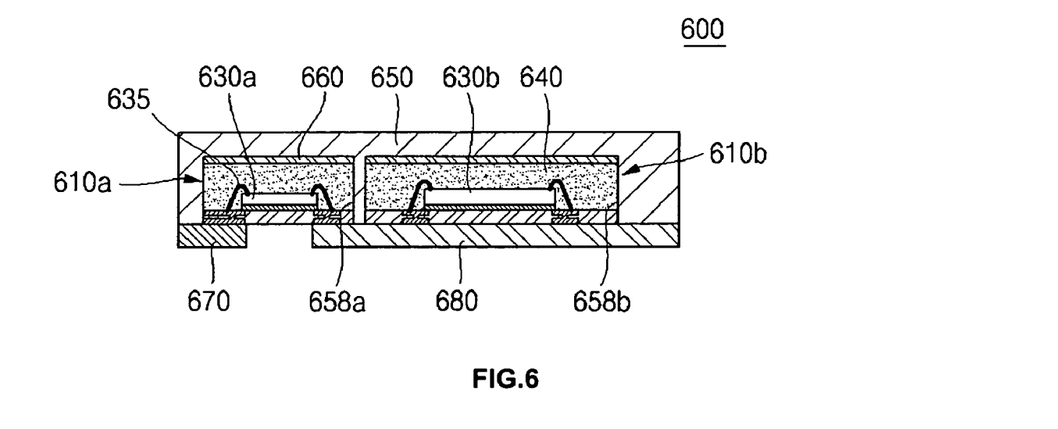
FIG. 6 is a cross-sectional view of a memory card constructed in accordance with a sixth embodiment of the present invention, further illustrating the first and second covers of the memory card in a closed position.

Referring now to FIG. 6, there is shown a memory card constructed in accordance with a sixth embodiment of the present invention. The memory card 600 of the sixth embodiment bears similarity in construction to the memory card 100 of the first embodiment, with the 600 series reference numerals in FIG. 6 being used to identify the same structures identified by the corresponding 100 series reference numerals included in FIGS. 1A-1E. In this regard, the distinctions between the memory cards 600, 100 will be discussed below.

As explained above, the memory card 100 includes the single module 110. Such single module 110 of the memory card 100 is advanced into and secured within the sole cavity 158 defined by the case 150 thereof. In contrast, the memory card 600 includes separate modules 610a, 610b. The module 610a includes its own corresponding electronic circuit device 630a, with the module 610b likewise including its own corresponding electronic circuit device 630b. The modules 610a, 610b are advanced into and secured within respective ones first and second cavities 658a, 658b defined by the case 650, in the manner shown in FIG. 6. The modules 610a, 610b are secured within respective cavities 658a, 658b by respective adhesive layers 660. In the arrangement of the memory card 600 shown in FIG. 6, the I/O pads of the memory card 600 will be defined by the module 610a, the test pads being defined by both modules 610a, 610b, such test pads being exposed by the movement of the second cover 680 from its closed position shown in FIG. 6 to its open position. As will be recognized, the I/O pads defined by the module 610a are exposed by the movement of the first cover 670 from its closed position shown in FIG. 6 to its open position. Though not shown, it is also contemplated that the modules 610a, 610b will be electrically connected to each other in a prescribed manner. Such electrical connection may be facilitated by the advancement of some conductive structural element through that portion of the case 650 separating the modules 610a, 610b from each other. As described above in relation to the memory card 500, the slideable attachment of the first and second cover 670, 680 to the case 650 in the memory card 600 may be implemented through the use of those structures described above in relation to either of the memory cards 100, 200. Similarly, the memory card 600 may be outfitted to include a guide block such as the guide blocks 355, 455 of the memory cards 300, 400, the first cover 670 being configured to mirror those of the first covers 370, 470 described above if any such guide block is included in the memory card 600.

Figure 7A:
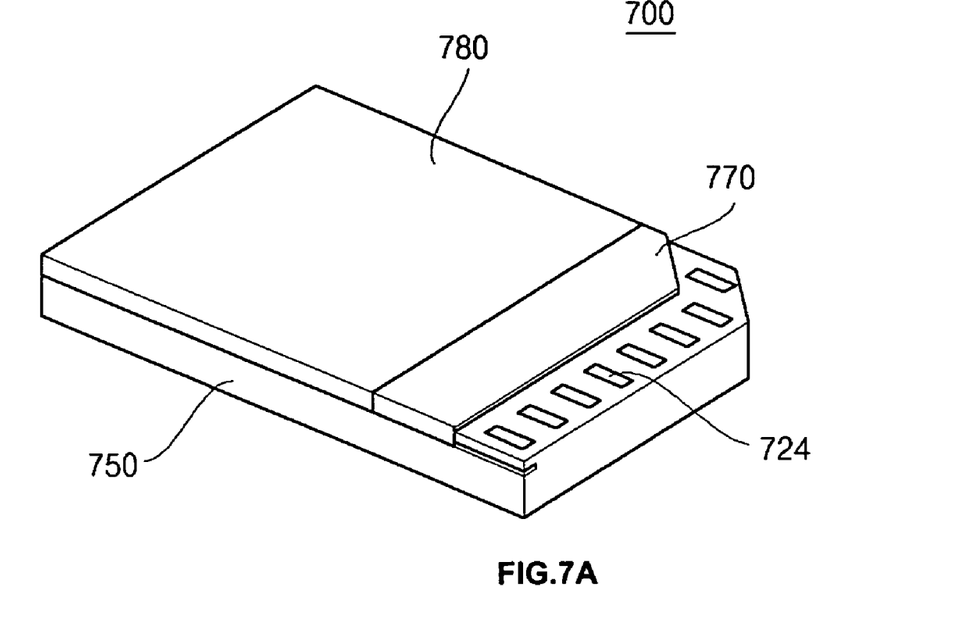
FIG. 7A is a bottom perspective view of a memory card constructed in accordance with a seventh embodiment of the present invention, further illustrating one of the first and second covers of the memory card in an open position and one of the first and second covers of the memory card in a closed position.
Figure 7B:
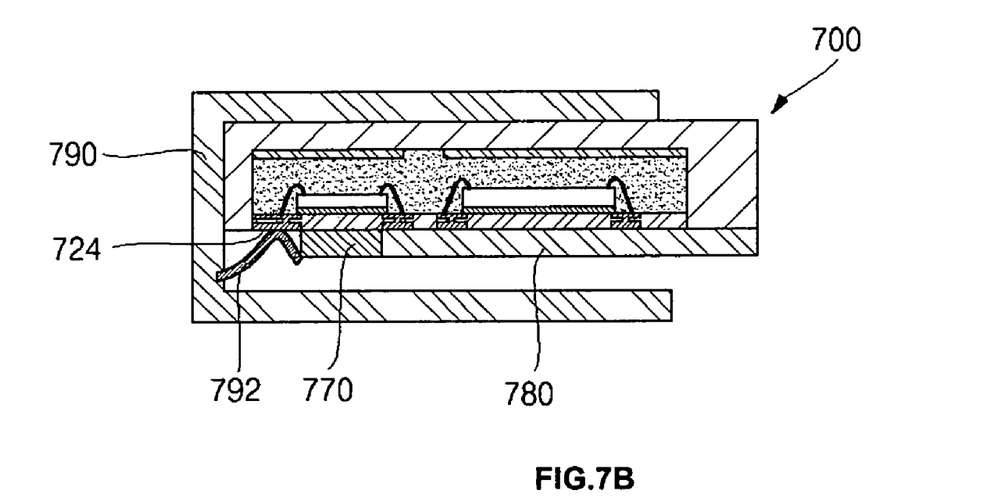
FIG. 7B is a cross-sectional view of the memory card of the seventh embodiment shown in FIG. 7A, but further illustrating the memory card as cooperatively engaged to an external electronic device.

Referring now to FIGS. 7A and 7B, there is shown a memory card 700 constructed in accordance with a seventh embodiment of the present invention. The memory card 700 of the seventh embodiment also bears similarity in construction to the memory card 100 of the first embodiment, with the 700 series reference numerals in FIGS. 7A and 7B being used to identify the same structures identified by the corresponding 100 series reference numerals included in FIGS. 1A-1E. In this regard, only the distinctions between the memory cards 700, 100 will be discussed below.

In the memory card 700, subsequent to the completion of the testing thereof, the second cover 780 is fixed to the case 750. Such affixation is preferably accomplished through the use of a suitable adhesive. Thus, upon such affixation of the second cover 780 to the case 750, only the first cover 770 of the memory card 700 is slideably moveable between the open and closed positions. The movement of the first cover 770 to its open position (as shown in FIG. 7A) effectively uncovers or exposes the I/O pads 724 of the memory card 700.

As seen in FIG. 7B, the memory card 700 is preferably configured such that when advanced into the socket 790 of an electronic device, the leads or terminals 792 of such device will act against the first cover 770 in a manner effectively sliding such first cover 770 from its closed position to its open position, thus allowing the I/O pads 724 to electrically communicate with the terminals 792. It is contemplated that the first cover 770 may be outfitted with an elastic body/spring which is oriented on the first cover 770 so as to be compressed when the first cover 770 is slid from its closed position to its open position, such elastic body/spring thus being compressed as a result of the advancement of the memory card 700 into the socket 790. When the memory card 700 is removed from the socket 790, the biasing force exerted by the elastic body/spring would effectively return the first cover 770 from its open position back to its closed position effectively covering the I/O pads 724. The slideable attachment of the first and second covers 770, 780 to the case 750 in the memory card 700 may be facilitated by through the use of those structures described above in relation to either the memory cards 100, 200. Further, the memory card 700 may be outfitted with a guide block similar to the guide blocks 355, 455 shown and described in relation to the memory cards 300, 400, with the first cover 770 of the memory card 700 being configured to mirror the first covers 370, 470 described above if such guide block is included in the memory card 700.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A memory card comprising:
   a circuit board having at least one I/O pad and at least one test pad formed thereon;
   at least one electronic circuit device mounted to the circuit board and electrically connected to the I/O pad and the test pad;
   a body covering the electronic circuit device and a portion of the circuit board such that the I/O pad is uncovered by the body, the electronic circuit device, the circuit board and the body collectively defining a module of the memory card;
   a case defining a bottom surface and a cavity which is disposed in the bottom surface, the cavity being sized and configured to accommodate the module which is inserted into the cavity such that the I/O pad is uncovered by the case;
   a first cover moveably attached to the case so as to overlap a portion of the bottom surface thereof, the first cover being slidably moveable along the bottom surface between a closed position whereat the I/O pad is covered by the first cover and an open position whereat the I/O pad is exposed; and
   a second cover moveably attached to the case so as to overlap a portion of the bottom surface thereof, the second cover being slidably moveable along the bottom surface between a closed position whereat the test pad is covered by the second cover and an open position whereat the test pad is exposed.

2. The memory card of claim 1 wherein the electronic circuit device comprises at least one semiconductor die.

3. The memory card of claim 1 wherein:
the module includes a plurality of I/O pads; and
a guide block is disposed on the bottom surface of the case and includes portions which extend between respective adjacent pairs of the I/O pads and partially define a plurality of slots, the I/O pads being located in respective ones of the slots.

4. The memory card of claim 3 wherein the first cover defines a plurality of couplers which are advanceable into respective ones of the slots in a nesting fashion when the first cover is moved to the closed position, the couplers each being sized and configured to cover a respective one of the I/O pads when the first cover is in the closed position.

5. The memory card of claim 1 wherein the module is secured to the case by an adhesive layer interposed therebetween.

6. The memory card of claim 1 wherein:
the case includes a spaced, generally parallel pair of elongate retainers; and
the first and second covers each define a spaced generally parallel pair of elongate slide grooves which are sized and configured to receive respective ones of the retainers;
the receipt of the retainers into respective ones of the slide grooves of each of the first and second covers effectuating the slidable attachment of the first and second covers to the case.

7. The memory card of claim 6 wherein:
the case includes an opposed pair of longitudinal sides; and
the retainers are formed to extend along respective ones of the longitudinal sides.

8. The memory card of claim 1 wherein:
the case includes a spaced, generally parallel pair of elongate retaining grooves; and
the first and second covers each define a spaced generally parallel pair of elongate protrusions which are sized and configured to be insertable into respective ones of the retaining grooves;
the receipt of the protrusions of each of the first and second covers into respective ones of the retaining grooves effectuating the slidable attachment of the first and second covers to the case.

9. The memory card of claim 8 wherein:
the retaining grooves are formed in the bottom surface.

10. The memory card of claim 1 wherein:
the case includes a rear side; and
an anti-protrusion portion is disposed on a portion of the bottom surface of the case, the anti-protrusion portion being sized and configured to prevent any portion of the second cover from protruding beyond the rear side of the case when the second cover is moved to the open position.

11. The memory card of claim 1 wherein first and second modules are advanced into respective ones of first and second cavities disposed in the bottom surface of the case, the first module including at least one I/O pad and at least one test pad, with the second module including at least one test pad.

12. A memory card comprising:
a circuit board having at a plurality of I/O pads and at least one test pad formed thereon;
at least one electronic circuit device mounted to the circuit board and electrically connected to the I/O pads and to the test pad,
a body covering the electronic circuit device and a portion of the circuit board such that the I/O pads and the test pad are each uncovered by the body, the electronic circuit device, the circuit board and the body collectively defining a module of the memory card;
a case defining a cavity which is sized and configured to accommodate the module which is inserted into the cavity such that the I/O pads and the test pad are each uncovered by the case;
a first cover moveably attached to the case so as to be slidably moveable along a first axis between a closed position whereat the I/O pads are each covered by the first cover and an open position whereat the I/O pads are each exposed; and
a second cover moveably attached to the case so as to be slidably moveable along the first axis between a closed position whereat the test pad is covered by the second cover and an open position whereat the test pad is exposed.

13. The memory card of claim 12 wherein a guide block is disposed on the case and includes portions which extend between respective adjacent pairs of the I/O pads and partially define a plurality of slots, the I/O pads being located in respective ones of the slots.

14. The memory card of claim 13 wherein the first cover defines a plurality of couplers which are advanceable into respective ones of the slots in a nesting fashion when the first cover is moved to the closed position, the couplers each being sized and configured to cover a respective one of the I/O pads when the first cover is in the closed position.

15. The memory card of claim 12 wherein:
the case includes a spaced, generally parallel pair of elongate retainers; and
the first and second covers each define a spaced generally parallel pair of elongate slide grooves which are sized and configured to receive respective ones of the retainers;
the receipt of the retainers into respective ones of the slide grooves of each of the first and second covers effectuating the slidable attachment of the first and second covers to the case.

16. The memory card of claim 12 wherein:
the case includes a spaced, generally parallel pair of elongate retaining grooves; and
the first and second covers each define a spaced generally parallel pair of elongate protrusions which are sized and configured to be insertable into respective ones of the retaining grooves;
the receipt of the protrusions of each of the first and second covers into respective ones of the retaining grooves effectuating the slidable attachment of the first and second covers to the case.

17. In a memory card having a case and module which is inserted into and secured within the case, the module including at least one I/O pad and at least one test pad which are not covered by the case, the improvement comprising:
a first cover moveably attached to the case so as to be slidably moveable along a first axis between a closed position whereat the I/O pad is covered by the first cover and an open position whereat the I/O pad is exposed; and a second cover moveably attached to the case so as to be slidably moveable along the first axis between a closed position whereat the test pad is covered by the second cover and an open position whereat the test pad is exposed.

18. The memory card of claim 17 wherein:

the case includes a spaced, generally parallel pair of elongate retainers; and the first and second covers each define a spaced generally parallel pair of elongate slide grooves which are sized and configured to receive respective ones of the retainers;

the receipt of the retainers into respective ones of the slide grooves of each of the first and second covers effectuating the slidable attachment of the first and second covers to the case.

* * * * *